United States Patent
Chen et al.

(10) Patent No.: US 6,806,184 B2
(45) Date of Patent: Oct. 19, 2004

(54) METHOD TO ELIMINATE COPPER HILLOCKS AND TO REDUCE COPPER STRESS

(75) Inventors: Ying-Ho Chen, Taipei (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/290,630

(22) Filed: Nov. 8, 2002

(65) Prior Publication Data

US 2004/0092100 A1 May 13, 2004

(51) Int. Cl.$^7$ .......................................... H01L 21/4763
(52) U.S. Cl. ........................ 438/633; 438/653; 257/751
(58) Field of Search ................................ 438/687, 627, 438/653, 660–663, 691–700, 672–675, 631–643; 257/751

(56) References Cited

U.S. PATENT DOCUMENTS

| | | | |
|---|---|---|---|
| 562,712 A | * 6/1896 | Liu et al. ................ | 438/631 |
| 4,704,367 A | 11/1987 | Alvis et al. ................ | 437/24 |
| 5,447,887 A | 9/1995 | Filipiak et al. ............ | 437/200 |
| 6,348,410 B1 | 2/2002 | Ngo et al. ................ | 438/660 |
| 6,368,948 B1 | 4/2002 | Ngo et al. ................ | 438/584 |
| 6,465,284 B1 | * 10/2002 | Adachi et al. ............ | 438/151 |
| 6,500,754 B1 | * 12/2002 | Erb et al. ................ | 438/626 |

FOREIGN PATENT DOCUMENTS

TW 457683 10/2001

* cited by examiner

*Primary Examiner*—Matthew Smith
*Assistant Examiner*—Calvin Lee
(74) *Attorney, Agent, or Firm*—Haynes and Boone, LLP

(57) ABSTRACT

A new method is provided for the creation of copper interconnects. An opening is created in a layer of dielectric, a layer of barrier material is deposited. The layer of barrier material extends over the surface of the layer of dielectric. A film of copper is deposited over the surface of the layer of barrier material. The copper film is polished down to the surface of the layer of barrier material, creating a first copper interconnect. The created first copper interconnect is subjected to a thermal anneal, inducing copper hillocks in the surface of the first copper interconnect by releasing copper film stress in the first copper interconnect. The copper hillocks are then removed by polishing the surface of the created first copper interconnect down to the surface of the surrounding layer of dielectric, creating a second and final copper interconnect.

27 Claims, 2 Drawing Sheets

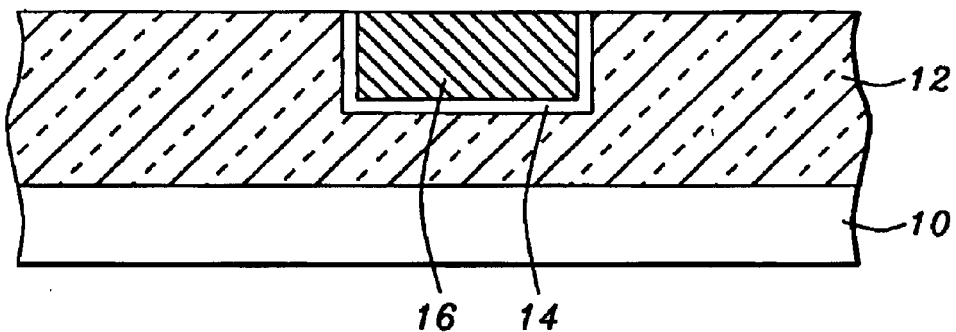
FIG. 1 – Prior Art
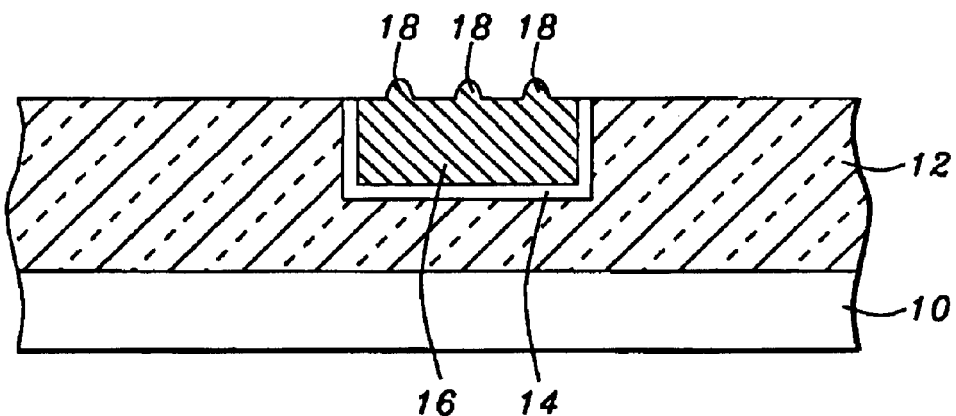
FIG. 2 – Prior Art
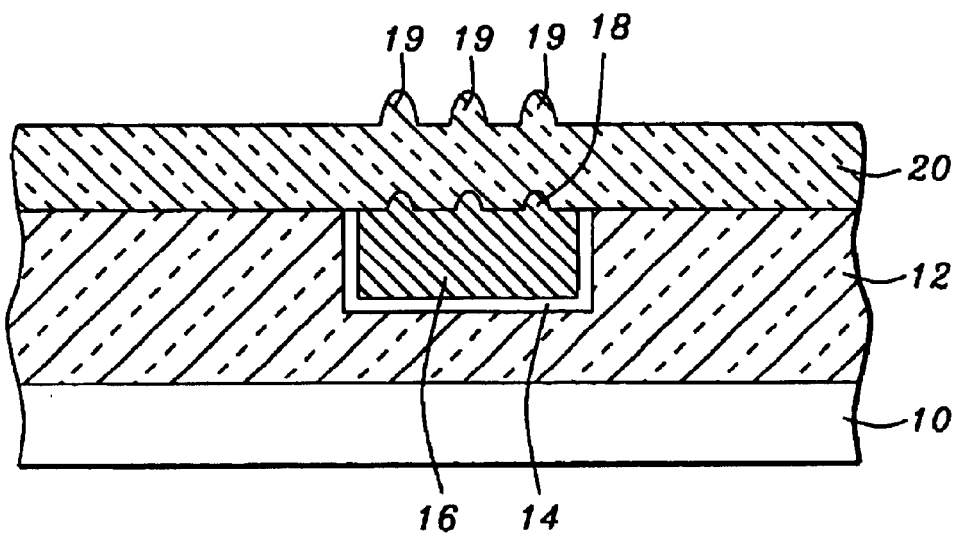
FIG. 3 – Prior Art

METHOD TO ELIMINATE COPPER HILLOCKS AND TO REDUCE COPPER STRESS

BACKGROUND OF THE INVENTION (1) Field of the Invention

The invention relates to the fabrication of integrated circuit devices, and more particularly, to a method for the creation of layers of copper having improved surface characteristics.

(2) Description of the Prior Art

After or as part of the creation of semiconductor devices, these devices or parts thereof must be interconnected. For these interconnections, metal such as aluminum or their alloys or copper are the preferred materials. Copper has of late been the material of choice in view of the more attractive performance characteristics of copper such as a low cost and low resistivity. Copper however has a relatively large diffusion coefficient into surrounding dielectrics such as silicon dioxide and silicon. Copper from an interconnect may diffuse into the silicon dioxide layer causing the dielectric to become conductive and decreasing the dielectric strength of the silicon dioxide layer. Copper interconnects should therefore be encapsulated by at least one diffusion barrier to prevent diffusion into the silicon dioxide layer. Silicon nitride is a diffusion barrier to copper, but the prior art teaches that the interconnects should not lie on a silicon nitride layer because it has a high dielectric constant compared with silicon dioxide. The high dielectric constant causes an undesired increase in capacitance between the interconnect and the substrate. Copper further has low adhesive strength to various insulating layers, while it has been proven inherently difficult to mask and etch a blanket copper layer into intricate circuit structures.

The deposition and processing of a layer of semiconductor material typically creates a thin film of material in which molecular stress in introduced due to the thermal processing of the deposited layer. This thermal stress results in the accumulation of sub-layers of the material, which show themselves as hillocks over the surface of the created thin film. This occurrence of surface hillocks is particularly troublesome where multiple overlying layers of copper are used as part of the structure since lower layer hillocks will have a magnifying effect on overlying layers of copper. The film stress is typically attributed to a mismatch of the Coefficient of Thermal Expansion (CTE) over adjacent layers of material, a mismatch that is more pronounced where one of the overlying layers of material comprises metal.

In view of the negative effects that can be introduced by surface hillocks, where these hillocks occur on the surface of patterned copper, a method of reducing or eliminating such hillocks is of benefit in processing semiconductor devices that use copper as an interconnect medium. The invention addresses concerns of hillock formation and provides a method whereby such a formation of hillocks of avoided.

U.S. Pat. No. 6,368,948 B1 (Ngo et al.) shows a process to reduce copper hillocks.

U.S. Pat. No. 4,704,367 (Alvis et al.) reveals a process to suppress hillocks using an Ar ion implant and thermal cycles.

U.S. Pat. No. 6,348,410 B1 (Ngo et al.) shows a low temperature copper hillock suppression process.

U.S. Pat. No. 5,447,887 (Fliplak et al.) shows a capping copper process.

SUMMARY OF THE INVENTION

A principle objective of the invention is to create copper interconnects that are free of surface hillocks.

Another objective of the invention is to create a layer of copper interconnect whereby the layer has reduced stress therein.

Yet another objective of the invention is to create copper interconnect metal of increased reliability.

In accordance with the objectives of the invention a new method is provided for the creation of copper interconnects. An opening is created in a layer of dielectric, a layer of barrier material is deposited. The layer of barrier material extends over the surface of the layer of dielectric. A film of copper is deposited over the surface of the layer of barrier material. The copper film is polished down to the surface of the layer of barrier material, creating a first copper interconnect. The created first copper interconnect is subjected to a thermal anneal, inducing copper hillocks in the surface of the first copper interconnect by releasing copper film stress in the first copper interconnect. The copper hillocks are then removed by polishing the surface of the created first copper interconnect down to the surface of the surrounding layer of dielectric, creating a second and final copper interconnect.

BRIEF DESCRIPTION OF THE DRAWINGS

FIGS. 1 through 3 show the conventional method of creating a copper interconnect, as follows:

FIG. 1 shows the cross section of a semiconductor surface over the surface of which a copper interconnect has been formed in a first layer of dielectric and surrounded by a barrier layer.

FIG. 2 shows hillock formation in the surface of the created copper interconnect.

FIG. 3 shows a cross section after a second layer of dielectric has been deposited over the surface of the first layer of dielectric, including the surface of the created copper interconnect.

FIG. 4 shows the cross section of a semiconductor surface over the surface of which a copper interconnect has been formed in a first layer of dielectric and surrounded by a barrier layer, the barrier layer is shown as extending over the surface of the first layer of dielectric.

FIG. 5 shows hillock formation in the surface of the created copper interconnect, thermal anneal is applied to the created copper interconnect to release stress and further stimulate hillock formation.

FIG. 6 shows a cross section after a surface of the created copper interconnect has been polished, the layer of TaN has been removed from the surface of the first layer of dielectric. The structure is now ready for the deposition of additional layers of dielectric (not shown) over the surface of the first layer of dielectric, including the surface of the created copper interconnect.

DESCRIPTION OF THE PREFERRED EMBODIMENTS

Figure 4:
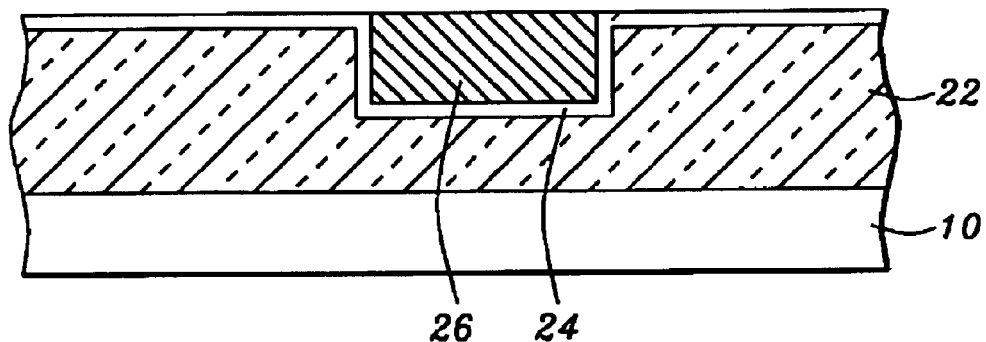
FIGS. 4 through 6 show the invention, as follows.

The conventional method of creating a copper interconnect is first highlighted using FIGS. 1 through 3.

In FIG. 1 is shown a cross section of the surface of a substrate 10, a first layer 12 of dielectric has been deposited over the surface of the substrate 10. The first layer of dielectric has been patterned and etched, creating an opening in the surface of the first layer 12 of dielectric for the creation of copper interconnect therein.

Before the deposition of the layer of copper, a layer 14 of barrier material is deposited over the surface of the first layer 12 of dielectric for reasons of avoiding diffusion of the copper into the first layer 12 of dielectric. Then the layer 16 of copper is deposited, using conventional metal diposition methods, after which the deposited layer 16 of copper is polished down to essentially the surface of the first layer 12 of dielectric.

This results in the cross section that is shown in FIG. 1. The created layer of copper as shown in the cross section of FIG. 1 is now ready for deposition of a second layer 20 of dielectric thereover as shown in the cross section of FIG. 3. Since elevated temperatures are applied for the deposition of the second layer 20 of dielectric, this temperature stimulates the relocation of copper molecules, a stimulation that is caused by internal stress that is created in a deposited film of copper at the time that a layer of copper is deposited.

This temperature stimulated molecular copper relocation results in the copper hillocks 18, FIG. 2, forming over the surface of the created layer 16 of copper. The copper hillocks 18 in other words form during and as a result of the deposition of the second layer 20 of dielectric and is further stimulated by the elevated temperature that is required for the deposition of the second layer 20 of dielectric. The formed copper hillocks 18 are in profile further propagated through the second layer 20 of dielectric and show up over the surface thereof as surface irregularities 19, irregularities that are highly undesirable from the point of view of creating a high-performance semiconductor device.

It is the objective of the invention to prevent surface irregularities 19 during and as a result of forming copper interconnects. This is highlighted and explained in detail using FIGS. 4 through 6.

Shown in the cross section of FIG. 4 is the surface of a substrate 10, over the surface of which a first layer 22 of dielectric has been deposited. An opening, which may be an opening created as part of a damascene process and may therefore have the cross section of a single or a double damascene opening, is etched into the surface of the first layer 22 of dielectric for the creation of a copper interconnect therein. A single damascene opening comprises an interconnect via or an interconnect trench, a double damascene opening comprises an interconnect via and an interconnect trench. A layer 24 of barrier material is deposited over the surface of the first layer 22 of dielectric after the opening has been created in the surface thereof, this layer 24 of barrier material covers inside surfaces of the opening created in the surface of layer 22. After the deposition of the layer 24 of barrier material, a layer 26 of copper is blanket deposited over the surface of the layer 24 of barrier material, this layer 26 of copper is polished down to the surface of the layer 24 of dielectric, resulting in the cross section that is shown in FIG. 4.

Figure 5:
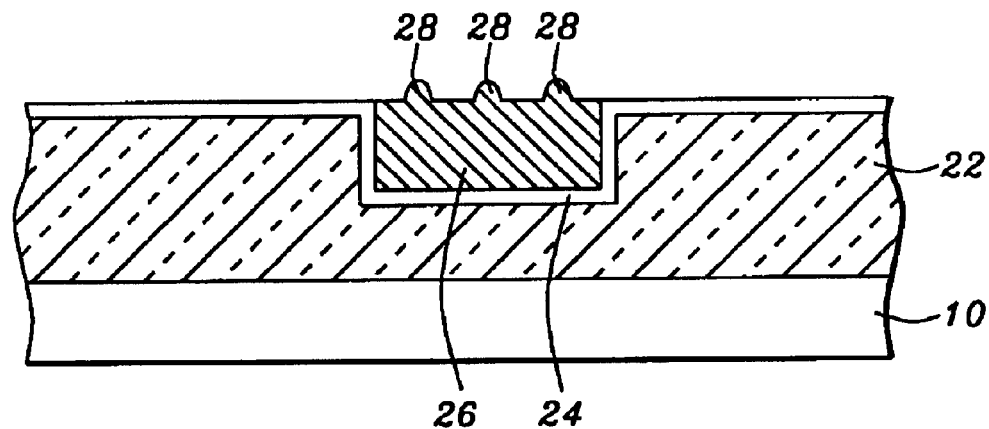

Prior to the deposition of a second layer of dielectric over the surface of the first layer 22 of dielectric, thereby including the surface of the created layer 26 of copper interconnect, the invention stimulates stress release and therewith stimulates the formation of copper hillocks 28, FIG. 5, over the surface of the copper layer 26 by applying a thermal anneal to the structure shown in cross section in FIG. 5. After the formation of the hillocks 28, FIG. 5, stress relieve has been achieved in the created layer 26 of copper. Additional high temperature processing, as is required for the deposition of a second layer of dielectric, will not again result in the formation of hillocks over the surface of copper layer 26.

Figure 6:
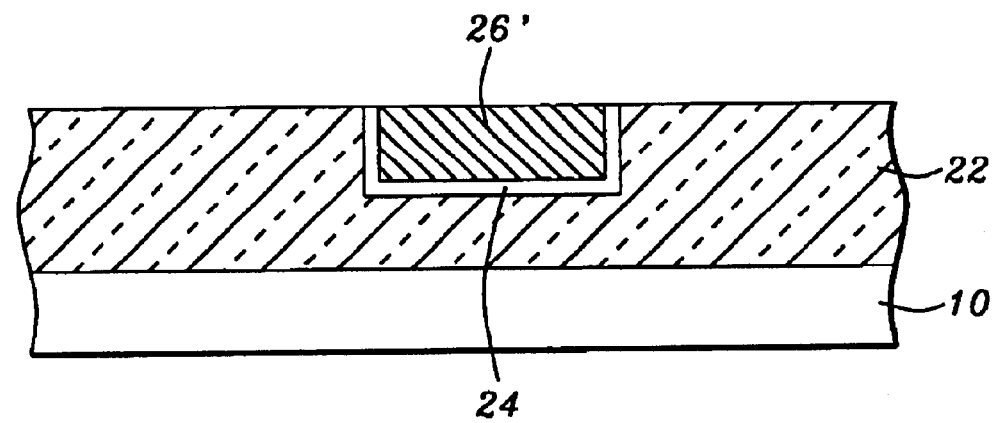

By therefore removing the copper hillocks 28, a removal that is accomplished by polishing the surface of the copper layer 26 that is shown in the cross section of FIG. 5, the created surface of the copper interconnect 26', FIG. 6, becomes and will remain free of copper hillocks, even if the layer 26' is additionally exposed to high temperature processing conditions. The polishing of the surface of copper layer 26 can be accomplished applying methods of Chemical Mechanical Polishing (CMP).

It must be noticed in the cross sections of FIGS. 5 and 6 that the surface of layer 26, FIG. 5, is higher than the surface of the finally polished layer of copper 26' shown in the cross section of FIG. 6. This difference in elevation of the surfaces of layers 26 and 26' of copper is caused by the presence of layer 24 over the surface of the first layer 22 of dielectric. By therefore polishing the layer 26, FIG. 5, of copper down to the surface of the first layer of dielectric, copper that is located in layer 26, FIG. 5, above the plane of the surface of the first layer 22 of dielectric is also removed. It is to be expected that this additionally removed copper contains molecular irregularities since this layer of copper is close to the copper hillocks 28. The additional removal of this layer of copper therefore assures that irregularities that are close to the surface of copper layer 26, FIG. 5, are also removed after the copper hillocks 28 have been removed. This further improves the planarity of the polished layer 26', FIG. 6, and further removes the likelihood of copper hillocks forming after the layer 26', FIG. 6, of copper has been polished.

A typical diffusion barrier layer 24, deposited by for instance rf. sputtering, may contain silicon nitride, phosphosilicate glass (PSG), silicon oxynitride, aluminum, aluminum oxide (AlxOy), tantalum, tungsten, titanium nitride, niobium, or molybdenum. The preferred material for the barrier layer 24 of the invention is titanium nitride. A barrier layer is preferably about 100 and 500 Angstrom thick and more preferably about 300 Angstrom thick.

Further can be cited the deposition of a barrier layer of SiN using PECVD under a temperature between about 200 and 500 degrees C., a pressure between about 1 mTORR and 100 TORR, a time between about 2 and 100 seconds, an environment of $SiH_4+NH_3+N_2$ or $Si_2H_6+NH_3+N_2$ or $SiH_4+N_2+Ar$ using a plasma or thermal process.

The deposition of a first and second layer of dielectric may comprise the deposition of a layer of silicon oxide, deposited using either LPCVD, PECVD, or APCVD processing, at a temperature between about 200 to 800 degrees C. to a thickness between about 1,000 to 10,000 Angstrom. It must thereby be pointed out that the second layer of dielectric, FIG. 3, must be created using a thermal process for the hillocks 19, FIG. 2 to appear on the surface of the second layer of dielectric.

The etching of a layer of dielectric can be accomplished by applying an anisotropic, RIE processing, using $CHF_3$ as an etchant.

Conductors are typically isolated from each other and from underlying conductive elements by a suitable dielectric, a suitable dielectric being, for instance silicon dioxide ("oxide", doped or undoped) or silicon nitride ("nitride"), silicon oxynitride, fluoropolymer, parylene, polyimide, tetra-ethylortho-silicate (TEOS) based oxides, boro-phosphate-silicate-glass (BPSG), phospho-silicate-glass (PSG), boro-silicate-glass (BSG), oxide-nitride-oxide (ONO), plasma enhanced silicon nitride (PSiNx), oxynitride. A low dielectric constant material, such as hydrogen silsesquioxane. HDP-FSG (high-density-plasma fluorine-doped silicate glass) is a dielectric that has a lower dielectric constant than regular oxide.

The most commonly used and therefore the preferred dielectrics are silicon dioxide (doped or undoped), silicon oxynitride, parylene or polyimide, spin-on-glass, plasma oxide or LPCVD oxide.

The step of anneal of the invention can be applied using a rapid thermal anneal in a temperature range between about 300 and 400 degrees C. for a time between about 20 and 40 seconds. The anneal temperature may be varied dependent on the thickness of the created copper interconnect and the thickness of the deposited first layer of dielectric.

If a thermal deposition process is used for the deposition of a second layer of dielectric (not shown) over the surface of layer 22, the hillocks 19 as shown in the cross section of FIG. 3 will be visible. The invention therefore allows for the second layer of dielectric to be deposited over the surface of the first layer 22 of dielectric while using a thermal process and, since the source of the hillocks has been removed, these hillocks will no longer appear over the surface of the second layer of dielectric.

The invention can be summarized as follows:

Provide a substrate

Deposit a first layer of dielectric over the surface of the substrate

Create an opening in the surface of the first layer of dielectric

Deposit a layer of barrier material over the surface of the first layer of dielectric, including inside surfaces of the created opening Deposit a layer of copper of the surface of the layer of barrier material Polish the deposited layer of copper down to the surface of the layer of barrier material, creating a copper interconnect Apply a thermal anneal to the created structure, most notably to the deposited and polished layer of copper Polish the layer of barrier material down to the surface of the first layer of dielectric, thereby polishing the created copper interconnect, and Deposit a second layer of dielectric over the surface of the first layer of dielectric, including the surface of the polished layer of copper.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creation of a copper interconnect, comprising steps of:

creating a copper interconnect surrounded by a layer of barrier material in an opening created in a first layer of dielectric that has been deposited over a substrate, the layer of barrier material overlying said first layer of dielectric;

stimulating stress release in the copper interconnect and therewith stimulating the formation of copper hillocks over the surface of the copper interconnect by annealing said copper interconnect, thereby preventing formation of hillocks during additional high temperature processing of said copper interconnect; and removing the copper hillocks by polishing said annealed copper interconnect and said layer of barrier material overlying said first layer of dielectric down to said first layer of dielectric, thereby additionally removing the copper interconnect from above a plane of the surface of the first layer of dielectric, thereby assuring additional removal of copper interconnect irregularities close to the surface of the copper interconnect, thereby further improving planarity of the copper interconnect and further decreasing potential formation of copper hillocks over the copper interconnect.

2. The method of claim 1, said annealing said copper interconnect comprising applying a temperature between about 300 and 400 degrees C. for a time between about 20 and 40 seconds.

3. The method of claim 1, additionally depositing a second layer of dielectric over said first layer of dielectric.

4. The method of claim 3, said additionally depositing a second layer of dielectric comprising a thermal deposition process.

5. The method of claim 1, said layer of barrier material comprising titanium nitride.

6. The method of claim 1, said layer of barrier material being deposited to a thickness between about 100 and 500 Angstrom.

7. The method of claim 1, said opening created in said first layer of dielectric comprising a single damascene opening of an interconnect via or of an interconnect trench.

8. The method of claim 1, said opening created in said first layer of dielectric comprising a double damascene opening of an interconnect via and an interconnect trench.

9. A method for the creation of a copper interconnect, comprising steps of:

providing a substrate;

depositing a first layer of dielectric over said substrate;

patterning and etching said first layer of dielectric, creating at least one opening in the surface thereof;

depositing a layer of barrier material over said first layer of dielectric, thereby including inside surfaces of said at least one opening;

depositing a layer of copper over said layer of barrier material;

polishing said layer of copper down to said layer of barrier material, creating a first copper interconnect;

stimulating stress release in the copper interconnect and therewith stimulating the formation of copper hillocks over the surface of the copper interconnect by annealing said copper interconnect, thereby preventing formation of hillocks during additional high temperature processing of said copper interconnect; and removing the copper hillocks by polishing said layer of barrier material down to aid first layer of dielectric, thereby polishing said first copper interconnect, thereby additionally removing the first copper interconnect from above a plane of the surface of the first layer of dielectric, thereby assuring additional removal of first copper interconnect irregularities close to the surface of the first copper interconnect, thereby further improving planarity of the first copper interconnect and further decreasing potential formation of copper hillocks over the first copper interconnect.

10. The method of claim 9, said annealing said first copper interconnect comprising applying a temperature between about 300 and 400 degrees C. for a time between about 20 and 40 seconds.

11. The method of claim 9, additionally depositing a second layer of dielectric over said first layer of dielectric.

12. The method of claim 11, said additionally depositing a second layer of dielectric comprising a thermal deposition process.

13. The method of claim 9, said layer of barrier material comprising titanium nitride.

14. The method of claim 9, said layer of barrier material being deposited to a thickness between about 100 and 500 Angstrom.

15. The method of claim 9, said at least one opening created in said first layer of dielectric comprising a single damascene opening of an interconnect via or of an interconnect trench.

16. The method of claim 9, said at least one opening created in said first layer of dielectric comprising a double damascene opening of an interconnect via and an interconnect trench.

17. A method of creating and removing hillocks in a copper interconnect, comprising step of:

creating a copper interconnect in a first layer of dielectric, a plane of the surface of said copper interconnect being removed from a plane of a surface of said first layer of dielectric by a distance;

creating hillocks in said copper interconnect by applying a thermal anneal to said copper interconnect; and removing said hillocks in said copper interconnect by reducing said distance to zero, thereby removing the copper interconnect from above the plane of the surface of the first layer of dielectric, thereby assuring additional removal of copper interconnect irregularities close to the surface of the copper interconnect, thereby further improving planarity of the copper interconnect and further decreasing potential formation of copper hillocks over the copper interconnect.

18. The method of claim 17, said distance comprising a thickness of a layer of material deposited over said first layer of dielectric.

19. The method of claim 18, said layer of material comprising barrier material.

20. The method of claim 19, said barrier material comprising titanium nitride.

21. The method of claim 20, said titanium nitride having a thickness of between about 100 and 500 Angstrom.

22. The method of claim 17, said thermal anneal comprising applying a temperature between about 300 and 400 degrees C. for a time between about 20 and 40 seconds.

23. The method of claim 17, said removing said hillocks in said copper interconnect by reducing said distance to zero comprising methods of Chemical Mechanical Polishing applied to said created copper interconnect.

24. The method of claim 17, additionally depositing a second layer of dielectric over said first layer of dielectric.

25. The method of claim 24, said additonally depositing a second layer of dielectric comprising a thermal deposition process.

26. The method of claim 17, said copper interconnect created in said first layer of dielectric comprising a single damascene opening of an interconnect via or of an interconnect trench.

27. The method of claim 17, said copper interconnect created in said first layer of dielectric comprising a dual damascene opening of an interconnect via and an interconnect trench.

* * * * *